United States Patent
Spangler et al.

(10) Patent No.: US 7,141,114 B2
(45) Date of Patent: Nov. 28, 2006

(54) PROCESS FOR PRODUCING A CRYSTALLINE SILICON INGOT

(75) Inventors: Michael V. Spangler, Moses Lake, WA (US); Carl D. Seburn, Moses Lake, WA (US)

(73) Assignee: REC Silicon Inc, Moses Lake, WA (US)

(\*) Notice: Subject to any disclaimer, the term of this patent is extended or adjusted under 35 U.S.C. 154(b) by 41 days.

(21) Appl. No.: 10/883,644

(22) Filed: Jun. 30, 2004

(65) Prior Publication Data

US 2006/0000409 A1 Jan. 5, 2006

(51) Int. Cl.
*C30B 15/20* (2006.01)

(52) U.S. Cl. .............................. 117/81; 117/11; 117/13; 117/83

(58) Field of Classification Search ................. 117/11, 117/13, 18, 81, 83
See application file for complete search history.

(56) References Cited

U.S. PATENT DOCUMENTS

| | | | |
|---|---|---|---|
| 4,249,988 A | 2/1981 | Lavigna | |
| 5,116,456 A * | 5/1992 | Nestor | 117/208 |
| 5,415,125 A | 5/1995 | Fujita | |
| 5,588,993 A | 12/1996 | Holder | |
| 5,798,137 A | 8/1998 | Lord | |
| 5,814,148 A * | 9/1998 | Kim et al. | 117/13 |
| 5,853,480 A | 12/1998 | Kubota | |
| 5,919,303 A * | 7/1999 | Holder | 117/13 |
| 5,961,944 A | 10/1999 | Aratani et al. | |
| 6,110,272 A * | 8/2000 | Aikawa et al. | 117/13 |
| 6,284,040 B1 * | 9/2001 | Holder et al. | 117/13 |
| 6,315,828 B1 | 11/2001 | Holder et al. | |
| 6,605,149 B1 | 8/2003 | Arvidson | |
| 2002/0083886 A1 | 7/2002 | Katoh | |
| 2003/0089302 A1 | 5/2003 | Hartmann | |
| 2003/0101924 A1 | 6/2003 | Holder | |
| 2003/0131783 A1 | 7/2003 | Arvidson | |

\* cited by examiner

*Primary Examiner*—Felisa Hiteshew
(74) *Attorney, Agent, or Firm*—Klariquist Sparkman, LLP

(57) ABSTRACT

An improved process for producing a crystalline silicon ingot, a crystalline silicon wafer and a photovoltaic cell using the directional solidification process, and more particularly to loading and preparing a mold for the process of directional solidification. At least one rod polysilicon section and at least one chunk polysilicon, chip polysilicon or granular polysilicon is loaded into the mold, increasing packing density and thermal conductivity of the polysilicon contents while reducing contamination and resources expended to process a production cycle.

50 Claims, 6 Drawing Sheets

PROCESS FOR PRODUCING A CRYSTALLINE SILICON INGOT

CROSS REFERENCE TO RELATED APPLICATIONS

There are no other applications related to the present application.

BACKGROUND

Components or products which generate electricity from light, commonly called solar panels, necessarily require one or more photovoltaic cells which essentially comprise silicon in a crystalline form. Typically, photovoltaic cells are produced from crystalline silicon wafers, which are sliced or produced from larger bricks of silicon called crystalline silicon ingots. Such photovoltaic cells, and likewise their parent crystalline silicon wafers and crystalline silicon ingots, may be either a monocrystalline (single-crystal) structure or a polycrystalline (multi-crystal) structure—creating two distinct families of photovoltaic cells, crystalline silicon wafers and crystalline silicon ingots in the photovoltaic industry.

Photovoltaic cells, crystalline silicon wafers and crystalline silicon ingots representing a monocrystalline structure are typically prepared in a process called the Czochralski process. To begin the Czochralski process, refined and reasonably pure silicon feedstock, commonly referred to as "polysilicon", is loaded into a cylindrical, rounded bottom crucible and melted. When the polysilicon in the crucible has thoroughly melted into a molten silicon mass, the primary function of the Czochralski process commences as one skilled in the art directs machinery to dip and withdraw a "seed crystal" into/from the molten silicon mass. By slowly withdrawing (or "pulling") the seed crystal and carefully controlling the slow cooling rate, a single-crystal ingot can be "grown" to a desired size or weight. This process can be costly and time-consuming to create crystalline silicon ingots on a per kilogram basis.

The second family of photovoltaic cells, crystalline silicon wafers and crystalline silicon ingots are polycrystalline and contain a plurality of crystal structures. This characteristic makes them slightly less efficient as a photovoltaic cell, however, in most applications the lower manufacturing costs of polycrystalline silicon wafers and polycrystalline silicon ingots more than offset the lower efficiency and thus provide the highest economic returns. Crystalline silicon ingots with a polycrystalline structure are produced by the Bridgman-Stockbarger crystal growth process, also called the "directional solidification" process.

In the directional solidification process known to those skilled in the art, a generally rectangular, flat bottom container (herein called a "mold") is filled with polysilicon and subsequently melted under an inert atmosphere. When the polysilicon contents of the mold, called the "charge", have thoroughly melted to a desired state of a molten silicon mass, the bottom of the mold (and thus the charge contained inside) is allowed to cool in a controlled manner. As this cooling occurs, one or more crystals nucleate and grow upward in the charge, thereby pushing impurities out of the expanding crystal microstructure. This slow cooling process of the entire molten silicon mass allows the crystals to grow to a large size.

While methods of loading polysilicon into a crucible intended for the Czochralski process are reasonably known to those skilled in the art, the present invention is instead directed toward improvements in loading and preparing a mold for the directional solidification process. The differences between the Czochralski and directional solidification processes are significant, both in terms of apparatus, processes and results.

First, crucibles utilized in the Czochralski process are cylindrical, typically 45 to 60 cm in diameter, and have a hemispherical bottom or a bottom with substantially rounded corners. These round features are necessary for optimum crystal dipping/pulling conditions. On the other hand, molds utilized for the directional solidification process tend to be rectangular (or square) with generally right angle corners, flat sides and a flat bottom—resembling a box rather than a cylinder.

It follows that the crystalline silicon ingot produced by a Czochralski crucible will be rounded or cylindrical in shape, whereas a crystalline silicon ingot produced by a directional solidification mold will be a generally rectangular ingot with generally right angle corners. This rectangular shape resembling a block results in a more efficient shape for a subsequent wafer slicing operation when manufacturing photovoltaic cells.

There are also significant contrasts between the melting phases of the Czochralski process and the directional solidification process. Crucibles utilized for the Czochralski process are heated by a furnace that directs heat to the sides of the crucible, one crucible at a time. This is necessary due to the fact that the top of a Czochralski crucible must be kept clear for the seed crystal and for the dipping/pulling apparatus. On the other hand, directional solidification molds are typically heated from the top and bottom, with multiple molds placed adjacent to one another in a large furnace for batch processing.

The cooling and crystallization phases of the Czochralski process and directional solidification process are also significantly different. Cooling of a Czochralski crucible occurs only when the crucible is effectively empty and no more silicon can be practically withdrawn at the end of a production cycle. To note, in the Czochralski process the majority of molten silicon mass is cooled as it is withdrawn and crystallized upon the seed crystal—occurring near the top surface of the molten silicon mass or outside the crucible altogether. To the contrary, directional solidification molds and the entire molten silicon mass contained within the mold are cooled from the bottom, with the crystallization phase beginning at the bottom of the molten silicon mass and traveling upwards.

Since crystallization by directional solidification forces impurities upwards, the topmost layer of a directional solidification ingot is often contaminated, whereas on the Czochralski process these corresponding impurities remain leftover in the bottom of the crucible after the ingot has been permanently withdrawn from the crucible.

Since the directional solidification process does not require the slow dipping/pulling process required of the Czochralski process, directional solidification is a quicker and more cost effective means to produce crystalline silicon ingots on a per kilogram basis. When utilizing the directional solidification process, the cost of producing a given crystalline silicon ingot by directional solidification remains largely independent of the actual weight of the polysilicon placed into the mold prior to the melting phase. It follows, therefore, that if more polysilicon can be loaded into the mold and processed for a given amount of power, time and labor, then the cost per kilogram of a crystalline silicon ingot is reduced.

However, certain factors which tend to increase the yield or weight of a given resultant ingot using directional solidification may also tend to also increase contamination, power consumption, time and labor required to process the batch. A discussion of these issues and the disclosed improved process for directional solidification is further detailed in the following paragraphs.

SUMMARY

In one embodiment the present invention provides for a process of preparing a mold for directional solidification. The process includes providing a mold suitable for melting and cooling polysilicon by the process of directional solidification, and loading at least one rod polysilicon section into the mold. The process further includes loading at least one polysilicon selected from the group consisting of chunk polysilicon, chip polysilicon and granular polysilicon into the mold, and placing the mold into a furnace suitable for melting and cooling polysilicon by the process of directional solidification.

In another embodiment, the present invention provides a process of preparing a plurality of molds for directional solidification. The process includes providing a plurality of molds suitable for melting and cooling polysilicon by a process of directional solidification, wherein each mold is rectangular and has a flat bottom. The process further includes loading a plurality of rod polysilicon sections into each mold in an offset-layered configuration or crisscross-layered configuration, and loading at least one polysilicon material selected from the group consisting of chunk polysilicon, chip polysilicon and granular polysilicon into the mold. The process also includes placing the mold into a furnace suitable for melting and cooling the polysilicon contents by the process of directional solidification.

Other embodiments, and other features and objects of the present invention will be in part apparent to those skilled in the art and in part pointed out hereinafter.

BRIEF DESCRIPTION OF THE DRAWINGS

A more complete appreciation of the present invention may be readily obtained by reference to the following descriptions when considered in connection with the accompanying drawings, wherein.

DETAILED DESCRIPTION

Figure 1:
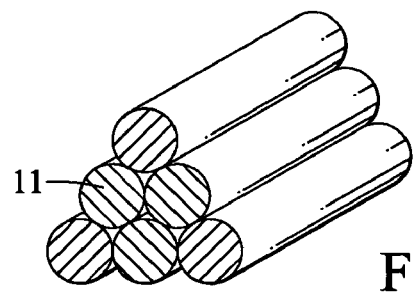
FIG. 1 is an isometric view of rod polysilicon stacked in a pyramidal configuration.

Before relating to specific examples, detailed statements describing the principles of the present invention and other aspects of polysilicon, directional solidification and preferred embodiments of the invention will be provided.

Forms of Polysilicon

Polysilicon utilized for the directional solidification process is typically first refined to be reasonably pure using the Siemens process, a process is well known to those of ordinary skill in the art. Depending on the particular flow and temperature profiles maintained in the Siemens polysilicon production, rod polysilicon 11 (FIGS. 1–19) harvested from a Siemens reactor may significantly vary in diameter and attributes. Within the polysilicon industry, rod polysilicon 11 is typically cut or broken into smaller, loose polysilicon pieces (chunk polysilicon 12 or chip polysilicon 13) immediately after harvesting from the reactor.

Chunk polysilicon 12 (FIGS. 5–7) (or chunks of polysilicon) for the purposes of this discussion, may be characterized by those loose pieces of polysilicon which typically, though not necessarily, range from about 2 to 20 cm across their largest dimension. Usually, but not always, chunk polysilicon 12 possesses an irregular shape, having sharp, jagged edges as a result of the fact that they originate and are typically broken from rod polysilicon 11 that has been subjected to severe mechanical impact or forces.

Chip polysilicon 13 (FIGS. 8–16), (or chips of polysilicon) for the purposes of this discussion, typically, though not necessarily, represent pieces of polysilicon that are smaller than chunk polysilicon 12 and may frequently resemble flake-like shapes. Chips may, but not necessarily, be derived from the debris left over when a rod harvested from a Siemens reactor is broken into chunk polysilicon 12.

Alternatively, as disclosed by the present invention, though not practiced within the industry, rods harvested from a Siemens reactor may instead be cut or broken into sections (or segments) of a desired length, rather than broken into chunks or chips. After growth to a suitable diameter in a Siemens reactor, (typically, but not limited to 80 to 140 mm), the rods of polysilicon are harvested intact in the usual manner, placed on suitable clean-room grade transport and sent to a breaking area. After inspection, the rods are broken, as necessary, to a maximum length as dictated by the mold size or specifications provided by the customer.

Breaking into sections can be accomplished with hammers, manual low-contamination impact devices, mechanical shears, saws, or multiple-hammer mechanical or hydraulic breakers. No special care or treatment of the broken ends is required, with the possible exception of cleaning after the use of a saw. The ends of the sections of rod polysilicon 11 can have any desired shape (e.g. they can be left as-broken, chipped, cut flat, or cut to a desired angle).

If transport to a customer or an off-site mold 10 (FIGS. 5–19) is necessary, suitable sections of rod polysilicon 11 are individually packaged in plastic bags. Shorter sections can be combined into one package of a desired length for packaging standardization and ease of handling. There is a significant advantage to keeping the shorter pieces derived from a single harvested rod together, as they will interlock better than random pieces from different rods. Such tight interlocking of segments allows for a high packing density of polysilicon in the mold 10 at a later time.

A "bridge section" harvested from a Siemens reactor is the short horizontal section of polysilicon that carries the electric current between two vertical rods. Bridge sections of the harvested rods can also be inspected, broken to a desired length, (if necessary), and packaged as usable segments of rod polysilicon 11. For purposes of the discussion and claims herein, and particularly to the topic of loading polysilicon into a mold 10 (FIGS. 5–19) for directional solidification, whole rods of polysilicon, portions of rods of polysilicon or any polysilicon resembling a solid cylindrical shape, whether intentionally or unintentionally configured to a given length, shall be collectively referred to as "rod polysilicon."

There are several standard sizes of molds that have been developed for the directional solidification process. One such standard size mold 10 is 69 cm square (69 cm long and 69 cm wide) and 42 cm tall. Another standard mold 10 that is smaller in size is 59 cm square (59 cm long and 59 cm wide) and 39 cm tall. Therefore, an optimal size of a segment of rod polysilicon 11 can be determined by the mold 10 for which the rod polysilicon 11 is intended.

Granular polysilicon 14 (FIGS. 17–19), which is a form of polysilicon that which has a generally uniform spherical shape, can be also used to load a mold 10 for the directional solidification process. As disclosed by the present invention, when used in conjunction with rod polysilicon 11, granular silicon is particularly well suited to filling airspaces or voids in a mold 10 containing rod polysilicon 11 and further provides stability against rod polysilicon 11 shifting during the melting process.

Granular polysilicon 14, contrary to rod polysilicon 11, chunk polysilicon 12 and chip polysilicon 13, is typically prepared by a fluidized-bed reaction process (rather than the Siemens process) and ranges from about 0.5 to 10 mm in diameter. Granular polysilicon 14 tends to be somewhat smaller than chip polysilicon 13, although the sizes may overlap.

Considerations in the Selection of Polysilicon

As mentioned in the foregoing, the cost variables of processing one production cycle to create a batch of polycrystalline ingots is largely independent of the actual weight of the polysilicon contained in the molds. Therefore, it follows that if more polysilicon can be packed into a given mold 10 and processed for a given amount of power, time, and labor, then the cost per kilogram of polycrystalline silicon ingot is reduced.

In order to increase (and ideally maximize) the amount and weight of polysilicon loaded into a mold 10, one must load a form of polysilicon which possesses a high packing density. Packing densities vary between various forms of polysilicon. For example, chunk polysilicon 12 has a rather low packing density of roughly 50%. (That is, meaning that given a specific volume, such as the volume represented by the internal capacity of a mold 10, a plurality of chunk polysilicon 12 pieces loaded into such a volume, on the average, would weigh roughly 50% of the weight of a solid block of polysilicon displacing the entire internal capacity of the mold 10.) By way of comparison, chip polysilicon 13 has a preferable packing density of roughly 57%, although this number may vary depending upon the actual size, shape and diversity of the chips.

The best packing density possible for perfectly spherical objects in a given volume ranges between 74% (corresponding to the Face-Centered Cubic configuration) and 65% (corresponding to a random loose fill). However, due to the imperfect sphericity and internal porosity of granular polysilicon 14 produced by the fluidized-bed process, granular polysilicon 14 has demonstrated a practical packing density of roughly 60% when placed into a mold 10 for directional solidification. The aforementioned exclusive forms of polysilicon and their corresponding packing densities reflect the industry practices of loading a mold for directional solidification.

If packing density and ease of handling were the sole factors in determining production costs and efficiency, it would appear that granular polysilicon 14 should be the preferred form of polysilicon for the directional solidification process. However, there are a number of considerations and specific problems within the present industry practices which can arise with exclusively utilizing granular polysilicon 14 to create crystalline silicon ingots by the directional solidification process.

Granular silicon created by a fluidized-bed process tends to possess a low bulk thermal conductivity, thus requiring a significantly higher thermal demand to melt the polysilicon charge. This increased thermal demand is typically overcome either by: (a) extending the time required for the melting process or (b) increasing the heat applied by the furnace. On the occasion that the heat is increased to offset the higher thermal demand, such additional thermal stress placed upon the mold 10 may distort or deform the mold 10, thereby introducing particles from the mold 10 into the molten silicon mass, (and thus contaminating the resulting crystalline silicon ingot with impurities as well). In extreme conditions, substantial thermal stress placed upon the mold 10 can cause a catastrophic breakdown of the mold 10. For these reasons, and other factors disclosed in the foregoing paragraphs, rod polysilicon 11, chunk polysilicon 12 and chip polysilicon 13 remain viable alternatives for the production of crystalline silicon ingots.

Rod polysilicon 11 and chunk polysilicon 12 have advantageous thermal conductivity properties over chip silicon and granular silicon, and thereby distribute heat during the melting process more efficiently. By a substantial margin, rod polysilicon 11 and chunk polysilicon 12 also have the highest density of silicon for a given surface area. Thus, it follows that given a fixed weight in kilograms, rod polysilicon 11 and chunk polysilicon 12 tend to have the lowest cost to melt as well as the lowest surface contamination per kilogram.

The edges of chunk polysilicon 12 are typically sharp and jagged. As a result, under the weight of a full charge, these sharp and jagged edges tend to scratch and gouge surfaces of a mold 10 and, in particular, the bottom surfaces of a mold 10. These scratches and gouges can cause damage to such an extent that small particles of the mold 10 are broken away from the surfaces of the mold 10. Such particles then become suspended in the molten silicon mass and ultimately incorporated into and contaminate the nucleating crystalline silicon ingot. Additionally, such scratches and gouges on the surfaces of the mold 10 may serve as nucleation sites that start and propagate cracks in the resulting crystalline silicon ingot. Over time, scratches and gouges in the mold 10, through repeated production cycles, may also fester into cracks in the physical structure of the mold 10.

While utilizing chip polysilicon 13 exclusively in a charge tends to minimize crucible damage, chip polysilicon 13 may result in higher than acceptable contamination levels, as discussed below.

Contamination of polysilicon produced by the Siemens process is typically introduced to the surface of the polysilicon product during harvesting and processing (breaking and packaging). Thus, an approximate measure of the potential for contamination is the surface area associated with a kilogram of polysilicon in its various forms. Rod polysilicon 11 typically has between 150 to 200 $cm^2$ of surface area per kilogram and chunk polysilicon 12 typically ranges from 900 to 1000 $cm^2$ of surface area per kilogram. Chip polysilicon 13 has roughly 6000 $cm^2$ of surface area per kilogram, although this figure varies significantly depending on the shape and sizing of the chip silicon product.

While granular polysilicon 14 may have over 100,000 $cm^2$ of surface area per kilogram, granular polysilicon 14 is typically produced and processed by wholly different processes, (e.g. a fluidized-bed process). The greatly reduced product handling required for fluid-bed processes provides lower contamination levels than would be expected based solely on its immense surface area.

As can be observed, the surface area available for contamination markedly increases as the weight of individual pieces or granules decreases. Since rod polysilicon 11, chunk polysilicon 12, and chip polysilicon 13 are typically produced by the same general process, (i.e. the Siemens process), the observed contamination levels generally correspond to the surface area represented by the given form of polysilicon. In this respect, rod polysilicon 11 provides a significant advantage over other forms of polysilicon, (including granular polysilicon 14), by virtue of its low surface area per kilogram of weight.

Moreover, from a contamination standpoint, there are other reasons to maximize the utilization of rod polysilicon 11 when loading a mold 10 for directional solidification. Given that contamination experienced within polysilicon derived from the Siemens process principally occurs during the harvesting and processing of rod polysilicon 11, it follows that minimizing the processing necessary to produce a given product also minimizes the contamination of the polysilicon product.

It is therefore desirable after harvesting rod polysilicon 11 from a Siemens reactor to process the polysilicon as little as necessary, packaging the rod polysilicon 11 in its most native form possible for subsequent loading into a mold 10 for the directional solidification process. Of course, due to handling and shipping constraints, or the maximum length dictated by a mold 10 or specified by a customer, rod polysilicon 11 should be broken only into sections so as to accommodate these specific needs.

Preparing a Charge for Directional Solidification

Once rod polysilicon 11 arrives at its destination for the process of directional solidification, it must have its packaging removed (if any) and be loaded into the mold 10. While the particular geometry of the mold 10 is not critical, it's exact dimensions, as well the clearance between it and the furnace walls, will determine how it is to be loaded for optimum results.

To begin loading a mold 10 for the directional solidification process, one places at least one segment of rod polysilicon 11 inside the mold 10 sufficient to form a first layer 11a (FIGS. 2–9) across the bottom of the mold 10. Alternatively, the first layer 11a of rod polysilicon 11 can be placed upon a layer of chunk polysilicon 12, chip polysilicon 13 or granular polysilicon 14, or of scrap polysilicon from the wafer forming operations. Although it is possible to leave some space between the individual segments of rod polysilicon 11 as well, it is not required and it is not advised, as this can adversely affect the overall packing density and thermal conductivity of the polysilicon charge.

A expansion gap 16 (FIGS. 6, 7, 9, 10, 12, 13, 15, 16, 18, 19) for expansion is typically provided between the sides and ends of the rod polysilicon 11 and the sides of the mold 10. Typically, molds suitable for melting and cooling polysilicon by the directional solidification process are composed of graphite, silicon carbide, silicon nitride, aluminum oxide, mullite or other materials capable of sustaining the extreme thermal demands placed upon the molds by the process. Since silicon has a greater thermal expansion coefficient than these materials, polysilicon loaded into a mold 10 and heated by a furnace will tend to expand more than the mold 10. Therefore, this expansion gap 16 provides room for expansion of the rod polysilicon 11 and avoids the buildup of stress, (as the polysilicon charge heats and expands). Failure to provide for this expansion gap 16 could lead to failure of the mold 10 and contamination of the polysilicon contents. Experience has shown that 5 cm of free space for the expansion gap 16 is generally sufficient, although this will depend on the specific dimensions of the mold 10.

While a segment of rod polysilicon 11 can be cut to a specific length for a given mold 10 to fit perfectly into a mold 10, this practice tends to introduce contaminants onto the rod polysilicon 11 in the cutting process. For this reason, it is advantageous for rod silicon to be broken, as precisely as practical, rather than cut to its desired length. While sharp corners may occur on a broken segment of rod polysilicon 11, such sharp corners tend to melt first, mitigating the problems associated with overstressing and fracturing a mold 10.

Once the first layer 11a of rod polysilicon 11 has been placed in the mold 10, the segment(s) can be wedged in place with chunk polysilicon 12, chip polysilicon 13 and/or granular polysilicon 14. Because segments of rod polysilicon 11 are round, they will tend to roll on the bottom of the mold 10 if this step is not performed. This step, therefore, is important as it stabilizes the current layer and provides a foundation for additional layers 11b, (assuming one or more layers of additional rod polysilicon 11 are capable of being loaded into the mold 10). Chunk polysilicon 12, chip polysilicon 13 or granular polysilicon 14 can then be added throughout the mold to fill any airspace voids left between segments of rod polysilicon 11 and the walls of the mold 10 until the height is about equal to that of the top of the first layer 11a of rod polysilicon 11.

Figure 2:
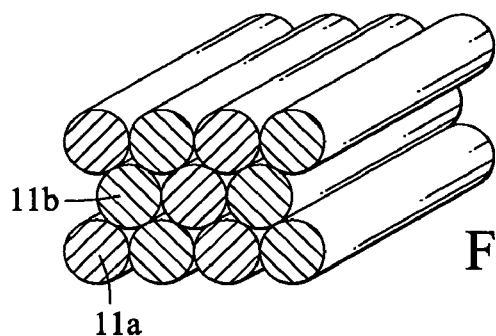
FIG. 2 is an isometric view of rod polysilicon stacked in an offset-layered configuration.

As possible within the physical constraints of the mold 10, additional layers 11b of segments of rod polysilicon 11 can ay be placed over the previous layer(s). Such layers can advantageously be placed in an offset and layered configuration, (herein called an "offset-layered configuration"), similar to the way round pipe may be stacked, as illustrated in FIG. 2.

Figure 3:
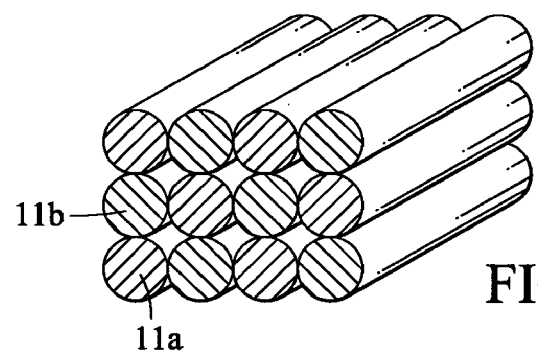
FIG. 3 is an isometric view of rod polysilicon stacked in an alternate configuration.

Although subsequent layers of rod polysilicon 11 can alternatively be placed directly over the first layer 11a of rod polysilicon 11, as shown in FIG. 3, (by keeping the center axes of the rod polysilicon 11 in approximate common vertical planes), this does not provide optimal packing density. Moreover, such a configuration as shown in FIG. 3 is also less stable than a configuration wherein the center axis of the rods are offset from layer to layer, as shown in FIG. 2.

Figure 4:
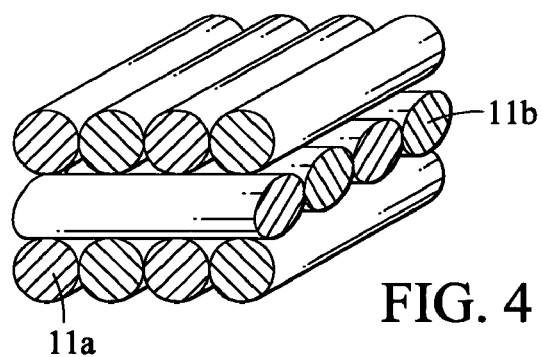
FIG. 4 is an isometric view of rod polysilicon stacked in a crisscross-layered configuration.
Figure 5:
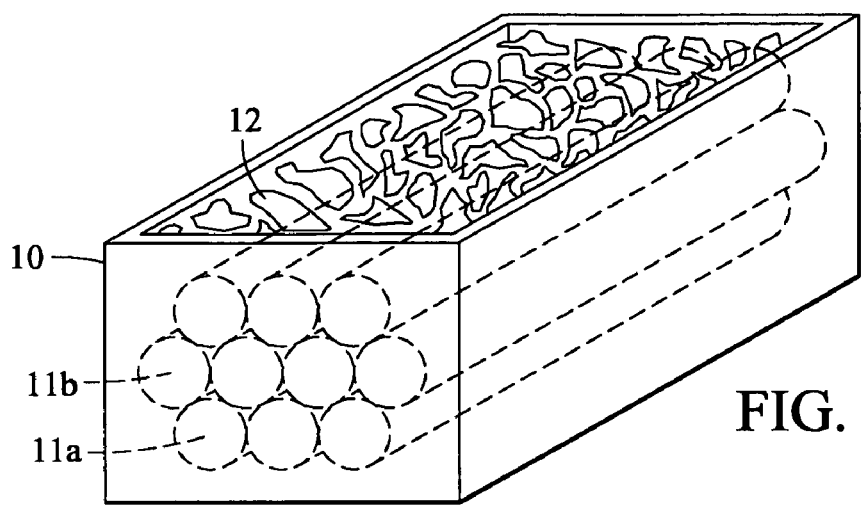
FIG. 5 is an isometric view of a mold loaded with rod polysilicon and chunk polysilicon in a horizontal offset-layered configuration.
Figure 6:
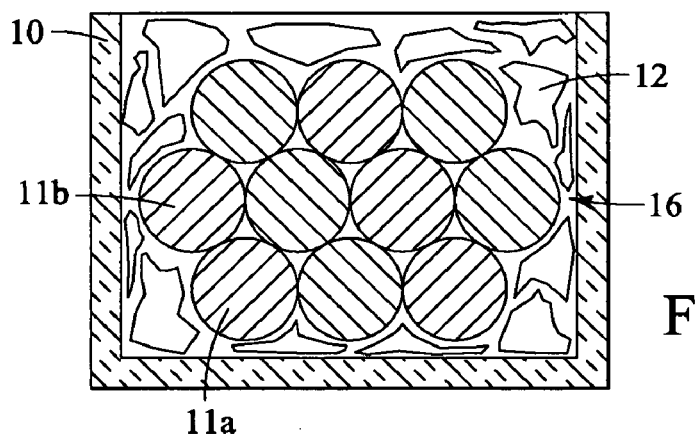
FIG. 6 is a frontal cross-section view of the mold loaded with rod polysilicon and chunk polysilicon in a horizontal offset-layered configuration shown in FIG. 5.
Figure 7:
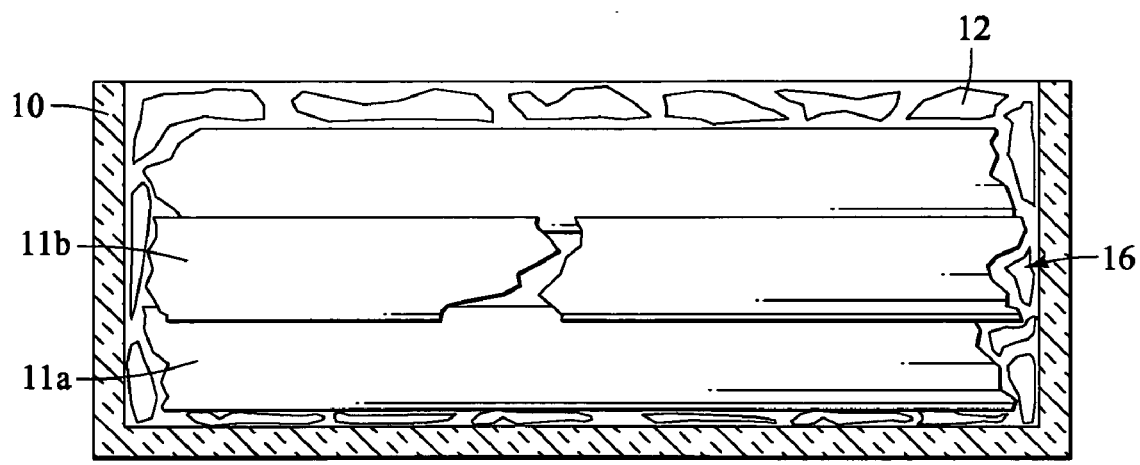
FIG. 7 is the side cross-section view of the mold loaded with rod polysilicon and chunk polysilicon in a horizontal offset-layered configuration shown in FIG. 5.
Figure 8:
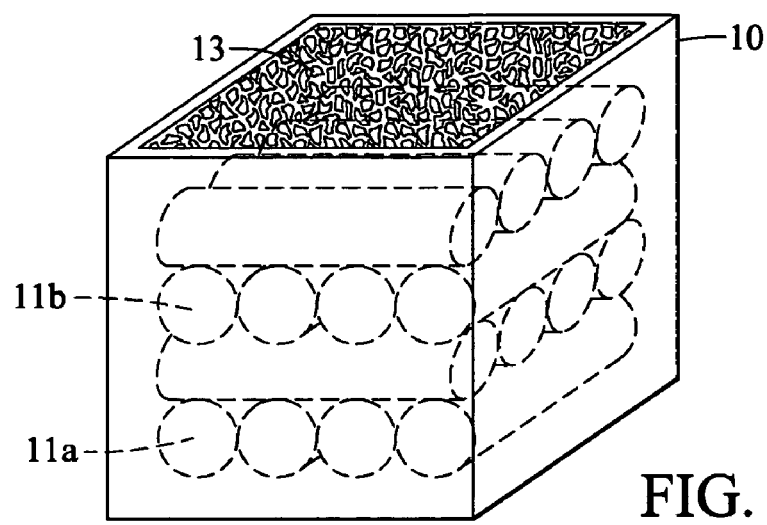
FIG. 8 is an isometric view of a mold loaded with rod polysilicon and chip polysilicon, wherein the rod polysilicon is configured in a crisscross-layered configuration.
Figure 9:
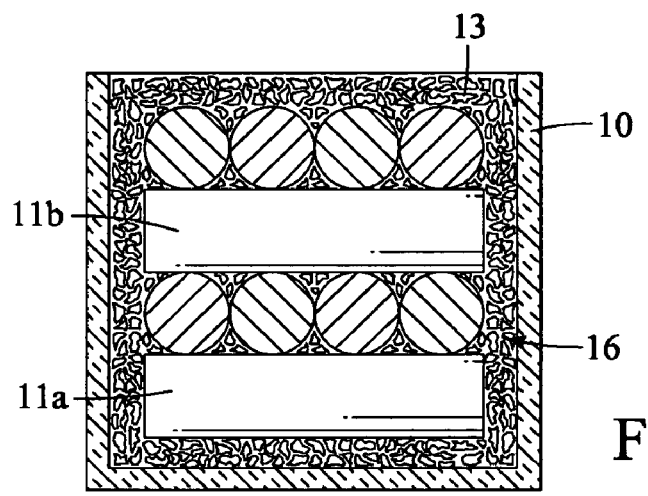
FIG. 9 is the frontal cross-section view of the mold loaded with rod polysilicon and chip polysilicon in a crisscross-layered configuration shown in FIG. 8.
Figure 10:
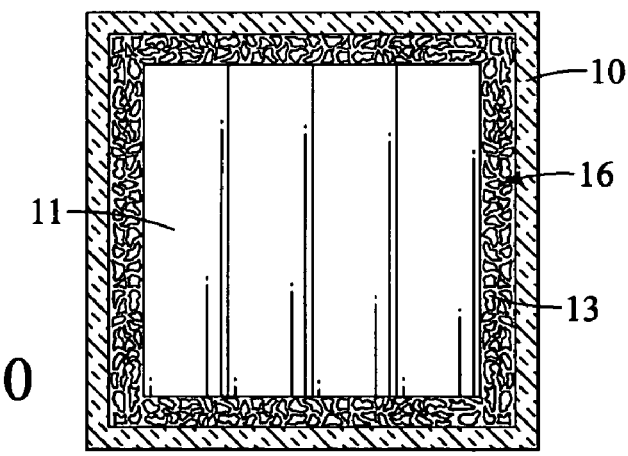
FIG. 10 is the top cross-section view of the mold loaded with rod polysilicon and chip polysilicon in a crisscross-layered configuration shown in FIG. 8.

Alternatively, if one desires to place additional layers 11b on top of the first layer 11a without utilizing an offset-layered configuration, it is advantageous instead to crisscross the segments of each layer with respect to the previous layer, as illustrated in FIG. 4, (herein called a "crisscross-layered configuration"). This is accomplished by positioning the segments so as to rotate the horizontal orientation of each layer by ninety degrees, or other suitable angle, with respect to the previous layer, providing additional stability to each layer and reducing the possibility of rolling or sliding of segments of rod polysilicon 11. Such a crisscross-layered configuration can also be accommodated within a quadrant or portion of a layer rather than the whole layer, or mixed with horizontal and vertical orientations of rod polysilicon, as shown in FIGS. 8, 9 and 10.

Consistent with the first layer 11a, additional layers 11b of rod polysilicon 11 can be provided with an expansion gap 16 between the rod polysilicon 11 and the mold 10 walls, for the same reasons as stated above. Likewise, if additional layers 11b are required, more chunk polysilicon 12, chip polysilicon 13 or granular polysilicon 14 can be added on each layer to fill the expansion gap 16 and space between the walls, and other airspace and voids in the mold 10 up the height of the current layer.

The steps of adding rod polysilicon 11 and loose polysilicon (chunk polysilicon 12, chip polysilicon 13 and granular polysilicon 14) continues until the mold 10 is full. As desired, additional chunk polysilicon 12, chip polysilicon 13 and granular polysilicon 14 can be then added on top of the topmost layer of polysilicon in the mold 10 as space allows.

Therefore, the top of the contents of the mold 10 consists of rod polysilicon 11, chunk polysilicon 12, chip polysilicon 13 or granular polysilicon 14, or a mixture thereof. As the mold 10 and furnace design may allow, additional segments of rod polysilicon 11 and loose chunk polysilicon 12, chip polysilicon 13 or granular polysilicon 14 can also be stacked above the walls of the mold 10. This overfilling further increases the total weight of the finished crystalline silicon ingot.

Sections of rod polysilicon 11 are significantly less likely to fall or slide off the top of an overfilled mold 10 than chunk polysilicon 12, chip polysilicon 13 and granular polysilicon 14. Therefore, sections of rod polysilicon 11 can also be utilized to contain loose polysilicon, holding it in place during the melting process so that overfilling does not cause undesirable effects such as spilling or contamination.

Those skilled in the art will observe the contrast of loading rod polysilicon 11 in a mold 10 for directional solidification in an offset-layering configuration versus loading rod sections into a Czochralski crucible in a pyramidal arrangement. (A "pyramidal" arrangement suggests that the horizontal area displaced by any upper layer of rod silicon is smaller or less than the horizontal area displaced by any comparative lower layer, as shown in FIG. 1). In a Czochralski crucible, the pyramidal arrangement is necessary to prevent rod polysilicon 11 from sliding or rolling during the melting phase. Absent this pyramidal arrangement, it is likely that the sharp corners and ends of the rod polysilicon 11 will strike the inside of the rounded Czochralski crucible walls with a concentrated force capable of damaging the crucible. Moreover, since a furnace used for the Czochralski process heats the contents of the crucible from the sides, polysilicon positioned next to the wall will be the first to melt, thus leaving the wall vulnerable to this form of damage.

On the other hand, with its rectangular shape and flat sidewalls, a mold 10 designed for directional solidification tends to distribute the force of a sliding or rolling section of rod polysilicon 11 substantially across its longitudinal contact with the side of the rod. Furthermore, since the furnaces typically utilized for a directional solidification process heat a mold 10 from the top and bottom, the rod polysilicon 11 positioned near the walls tends to be the last material to melt in the mold 10, offering better protection from sliding or rolling rod polysilicon 11.

Moreover, as a mold 10 is heated from the top, rod polysilicon 11 on top of other layers, and in direct contact with other layers and adjacent sections, will tend to melt first due to its increased thermal conductivity, avoiding sudden collapses of partially melted material. It should also be noted that loose polysilicon, particularly chunk polysilicon 12, has the effect of gently melting and slowly lowering rod polysilicon 11 into the melt by degrees, thus averting sudden drops, rolls or slides of the rod polysilicon 11.

For these reasons, a rectangular mold 10 with flat walls used for directional solidification, contrary to a rounded crucible used for the Czochralski process, can be loaded and stacked with sections of rod polysilicon 11 in the previously detailed offset-layering configuration or crisscross-layered configuration, allowing upper layers of rod polysilicon 11 to represent the equivalent (or even larger) footprint than comparative lower layers of rod polysilicon 11. The offset-layered configuration and criss-cross layered configuration provide for improved packing density, stability and thermal conductivity above and beyond the traditional methods of pyramidal stacking.

Figure 14:
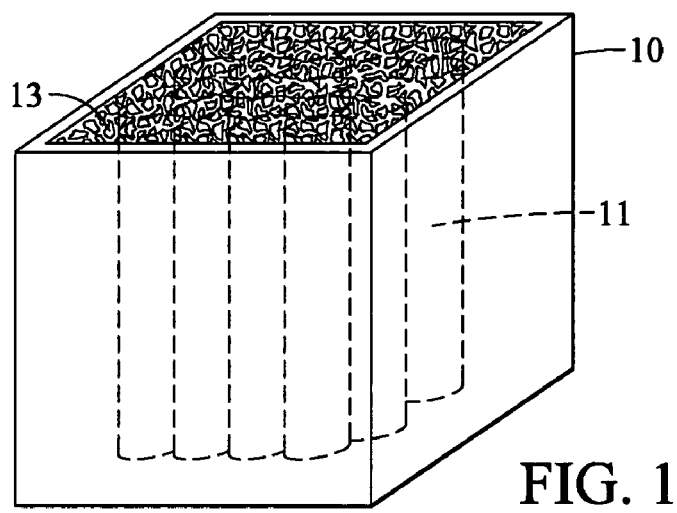
FIG. 14 is an isometric view of a mold loaded with rod polysilicon and chip polysilicon in a vertical offset-layered configuration.
Figure 15:
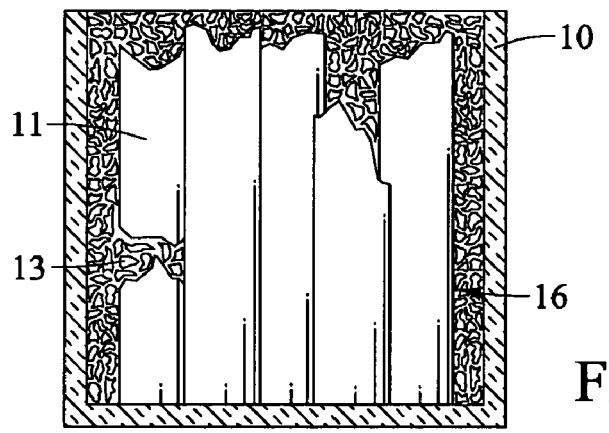
FIG. 15 is a frontal cross-section view of the mold loaded with rod polysilicon and chip polysilicon in a vertical offset-layered configuration shown in FIG. 14.
Figure 16:
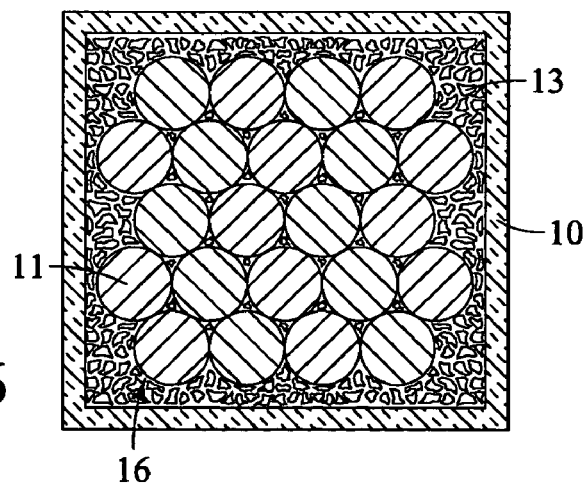
FIG. 16 is the top cross-section view of the mold loaded with rod polysilicon and chunk polysilicon in a vertical offset-layered configuration shown in FIG. 14.

Alternatively, sections of rod polysilicon 11 can be loaded into a mold 10 in a vertical orientation rather than horizontal orientation, (i.e. standing the segments of rod polysilicon 11 on end), as illustrated in FIGS. 14, 15 and 16. In such an orientation, it is desirable to also offset the centers of the segments of rod polysilicon 11, similar to that described in the above offset-layered configuration and crisscross-layered configuration. Again, the addition of chunk, chip polysilicon 13 or granular polysilicon 14 serves to improve the packing density while stabilizing the rod polysilicon 11 while it melts.

Figure 11:
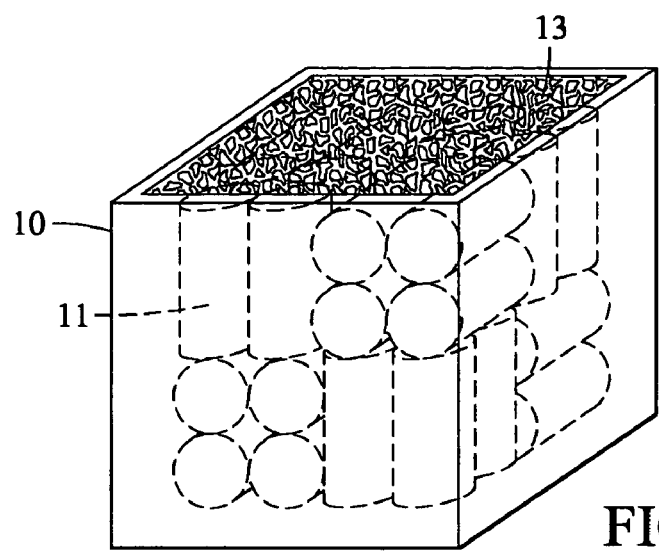
FIG. 11 is an isometric view of a mold loaded with rod polysilicon and chip polysilicon, wherein the rod polysilicon is configured in a mixed configuration.
Figure 12:
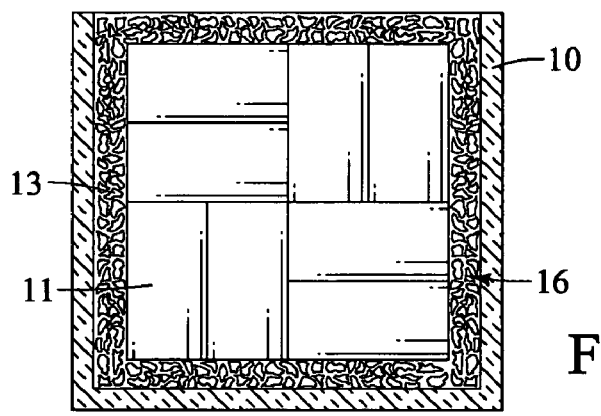
FIG. 12 is the frontal cross-section view of the mold loaded with rod polysilicon and chip polysilicon in a mixed configuration shown in FIG. 11.
Figure 13:
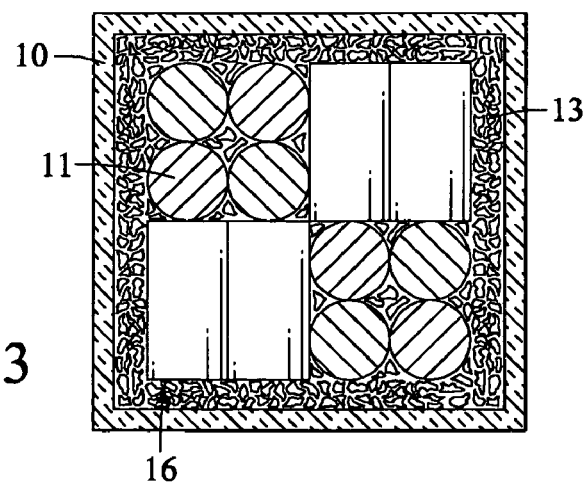
FIG. 13 is the top cross-section view of the mold loaded with rod polysilicon and chip polysilicon in a mixed configuration shown in FIG. 11.

If desired, a mix of configurations in both horizontal and vertical oriented rod polysilicon 11, whether or not criss-crossed, can be utilized, provided that a fill of loose polysilicon (chunk polysilicon 12, chip polysilicon 13 or granular polysilicon 14) complements the rod polysilicon 11. Such a mixed configuration is illustrated in FIGS. 11, 12 and 13.

Figure 17:
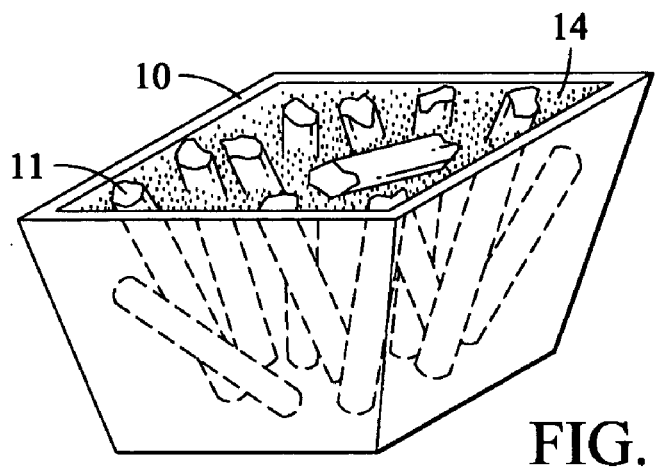
FIG. 17 is an isometric view of a mold loaded with rod polysilicon and granular polysilicon.
Figure 18:
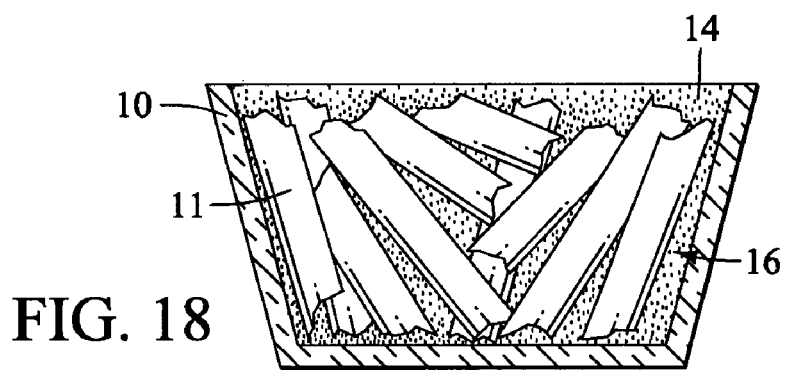
FIG. 18 is a frontal cross-section view of the mold loaded with rod polysilicon and granular polysilicon shown in FIG. 17.
Figure 19:
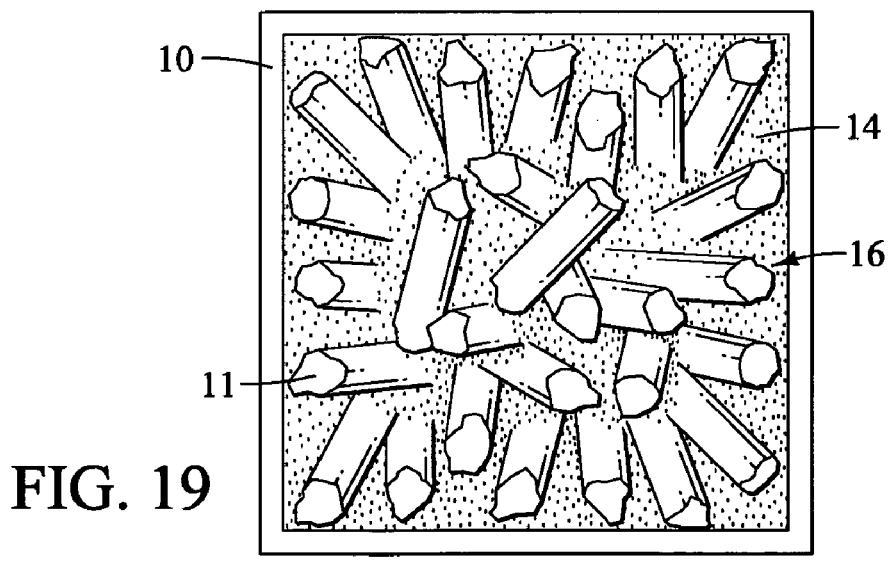
FIG. 19 is the top cross-section view of the mold loaded with rod polysilicon and granular polysilicon shown in FIG. 17.

Alternatively, it is also practical to rapidly load segments of rod polysilicon 11 and loose polysilicon (chunk polysilicon 12, chip polysilicon 13 or granular polysilicon 14) as shown in FIGS. 17, 18 and 19. While such a configuration may sacrifice a noticeable loss in packing density and thermal conductivity due to the lack of organization of the rod polysilicon 11, such a configuration nonetheless renders advantageous results over the present industry practices of loading a mold 10 with a single form of loose polysilicon (chunk polysilicon 12, chip polysilicon 13 or granular polysilicon 14).

Producing Crystalline Silicon Ingots

After the mold 10 has been loaded with the rod polysilicon 11 and loose polysilicon and the mold placed in a furnace, the rod polysilicon and loose polysilicon melt, at which time crystalline silicon ingots can be formed from the molten silicon.

There are two primary techniques utilized, each with their own corresponding suitable furnace types, to implement the directional solidification process. The first technique utilizes a mold 10 mounted inside an RF field provided by an induction furnace. The mold 10 is much taller than the RF coil, and after melting of the silicon charge occurs, the mold 10 is slowly withdrawn from the RF coil. Solidification and crystallization commences at the bottom of the crucible. The crystal microstructures continue to grow upwards as the crucible is lowered, until at the end of the process, individual large crystals extend from the bottom of the crucible upward.

A second and more common technique utilizes a stationary furnace, typically with resistance heaters at the top and bottom. The loaded mold 10 is placed in the furnace and the charge is melted under an inert atmosphere. Once the charge is thoroughly melted to a desired state, the power level of the lower heating element is reduced, thereby causing the molten silicon mass to cool from the bottom. By adjusting the power to the upper and lower heaters, a skilled operator can create the proper environment to allow crystals to form at the bottom of the mold 10 and grow upward to the top.

The exact times involved with either technique of the directional solidification process are dependent on the size of the charge, the composition of the mold 10, the furnace volume and power rating, and numerous other factors apparent to one skilled in the art.

Producing Crystalline Silicon Wafers & Photovoltaic Cells

Once cast and properly crystallized, a crystalline silicon ingot is sliced (or sawn) into smaller sections. The slicing process can either produce smaller crystalline silicon ingots that are subsequently sliced to crystalline silicon wafers, (more typical when using inner-diameter saws) or the crystalline silicon ingot can be directly sliced into crystalline silicon wafers (more typical when using wire saws.)

Once a crystalline silicon wafer is produced, one follows the general process of doping the substrate, assembling the cell, and combining the cells into modules, well known to those of ordinary skill in the art.

EXAMPLES

Given the above detailed descriptions, various examples of embodiments of the present invention will now be discussed in detail. For the following examples, a mold 10 has been selected for comparison, providing internal dimensions of 69 cm in length, 69 cm in width and 42 cm in height for an internal usable volume of 0.202 cubic meters. Given the density of solid polysilicon, an ingot displacing this entire usable volume would yield a finished weight of 470 kilograms, (i.e. representing a packing density of 100%).

If such a mold 10 were prepared by exclusively loading granular polysilicon 14, widely believed by the industry to be the optimal form of polysilicon due to its advantageous handling characteristics and packing density, (notwithstanding its low thermal conductivity), a packing density of approximately 60% would be achieved, translating to an initial charge and resulting crystalline silicon ingot weight of roughly 282 kilograms. By comparison, a carefully hand-loaded charge utilizing only chunk polysilicon 12 within the same mold 10 renders a packing density of 52%, resulting in an ingot weight of approximately 244 kilograms.

However, (using the same mold with hand-loaded chunk silicon 12, as above), practicing the disclosed the process by substituting several sections of rod polysilicon 11 to replace the volume otherwise occupied by several pieces of chunk polysilicon 12, the packing density increases to 56%—yielding an ingot weight of 265 kilograms. Further, extensive utilization of rod polysilicon 11 in an offset-layered configuration, (and continuing to utilize chunk polysilicon 12 to fill around the rod polysilicon 11), in accordance with embodiments disclosed herein, further boosts the packing density to 59% yielding an ingot weight of 280 kilograms.

In another example, (using the same mold 10 as above), extensive utilization of rod polysilicon 11 loaded in an offset-layered configuration with chip polysilicon 13, in accordance with embodiments disclosed herein, yields a packing density of 64% with an ingot weight of 300 kilograms.

In still another example, (using the same mold 10 as above), maximizing the use of rod polysilicon 11 in an offset-layered configuration in conjunction with utilizing granular polysilicon 14 as a loose fill material, in accordance with embodiments disclosed herein, achieves a packing density of 68% and a 320 kilogram ingot.

Thus, higher packing densities and ingot weights than those produced by current industry practices can be produced from a mix of rod polysilicon 11 and loose polysilicon (chunk polysilicon 12, chip polysilicon 13 or granular polysilicon 14) using the disclosed loading and preparation techniques. Thermal conductivity of the polysilicon charge is also increased, resulting in fewer resources expended, less contamination due to minimized surface area and a reduced cost of polysilicon feedstock. Moreover, larger crystalline silicon ingots produced by the disclosed processes have the capability of producing larger crystalline silicon wafers—which results in less waste per kilogram in the manufacture of photovoltaic cells.

Numerous modifications and variations of the present invention are possible in light of the above teachings. It is to be understood that embodiments of the invention are not limited to the specific features shown and described, since the means herein disclosed comprise preferred forms of putting embodiments of the invention into effect. The invention is, therefore, claimed in any of its forms or modifications within the proper scope of the appended claims appropriately interpreted in accordance with the doctrine of equivalents.

The invention claimed is:

1. A directional solidification process, comprising:
providing a mold suitable for melting and cooling polysilicon using a directional solidification process;
loading at least two rod polysilicon sections into the mold, wherein at least two rod polysilicon sections are in contact with one another;
loading at least one of chunk polysilicon, chip polysilicon or granular polysilicon into the mold;
heating the mold until the at least two rod polysilicon sections and at least one of chunk polysilicon, chip polysilicon or granular polysilicon melt to form a molten silicon mass; and
cooling the molten mass by the directional solidification process to cause the molten silicon mass to crystallize and form a polycrystalline silicon ingot within the mold.

2. The process of claim 1, and further comprising slicing a crystalline silicon wafer from the crystalline silicon ingot.

3. The process of claim 2, and further comprising producing a photovoltaic cell from the crystalline silicon wafer.

4. As a new article of manufacture, a crystalline silicon ingot prepared in accordance with the process of claim 1.

5. A directional solidification process, comprising:
providing a plurality of molds suitable for melting and cooling polysilicon using a directional solidification process;
loading at least two rod polysilicon sections into each mold, wherein at least two rod polysilicon sections are in contact with one another;
loading at least one of chunk polysilicon, chip polysilicon or granular polysilicon into each mold;
heating the plurality of molds until the at least two rod polysilicon sections and at least one of chunk polysilicon, chip polysilicon or granular polysilicon melt to form molten silicon masses; and
cooling the plurality of molds by the directional solidification process thereby causing the molten silicon masses to crystallize within the molds and form a plurality of polycrystalline silicon ingots.

6. The process of claim 5, and further comprising slicing a plurality of crystalline silicon wafers from the plurality of crystalline silicon ingots.

7. The process of claim 6, and further comprising producing a plurality of photovoltaic cells from the plurality of crystalline silicon wafers.

8. As a new article of manufacture, a plurality of crystalline silicon ingots prepared in accordance with the process of claim 5.

9. A directional solidification process, comprising:
providing a mold suitable for melting and cooling polysilicon by a directional solidification process, wherein the mold is rectangular and includes a flat bottom, the mold is defined by a length, a width and a height, the length of the mold is within the range 10 cm to 70 cm, the width of the mold is within the range 10 cm to 50 cm and the height of the mold is within the range 10 cm to 43 cm;
loading at least one rod polysilicon section defined by a diameter and a length into the mold, wherein the diameter of the at least one rod polysilicon section is within the range of 80 mm to 140 mm, the length of the at least one rod polysilicon section is within the range of 8 cm to 68 cm;
loading at least one of chunk polysilicon, chip polysilicon or granular polysilicon into the mold; and
placing the mold into a furnace suitable for melting and cooling the at least one rod polysilicon section and at least one of chunk polysilicon, chip polysilicon or granular polysilicon by the directional solidification process.

10. The process of claim 9, and further comprising:
heating the mold until the at least one rod polysilicon section and the at least one of chunk polysilicon, chip polysilicon or granular polysilicon melt to a molten silicon mass, wherein the mold is defined by a top and a bottom, and the furnace directs heat to the mold from the top and bottom; and
cooling the mold thereby causing the molten silicon mass to crystallize and form a crystalline silicon ingot.

11. The process of claim 10, wherein the crystalline silicon ingot is defined by a polycrystalline structure.

12. The process of claim 11, and further comprising slicing a crystalline silicon wafer from the crystalline silicon ingot.

13. The process of claim 12, and further comprising producing a photovoltaic cell from the crystalline silicon wafer.

14. As a new article of manufacture, a crystalline silicon ingot prepared in accordance with the process of claim 10.

15. A directional solidification process, comprising:
providing a plurality of molds suitable for melting and cooling polysilicon by a directional solidification process, wherein each mold is rectangular and includes a flat bottom, the mold is defined by a length, a width and a height, the length of the mold is within the range 10 cm to 70 cm, the width of the mold is within the range 10 cm to 50 cm and the height of the mold is within the range 10 cm to 43 cm;
loading at least one rod polysilicon section defined by a diameter and a length into each mold, wherein the diameter of the at least one rod polysilicon section is within the range of 80 mm to 140 mm, the length of the at least one rod polysilicon section is within the range of 8 cm to 68 cm;
loading at least one of chunk polysilicon, chip polysilicon or granular polysilicon into each mold; and
placing the molds into a furnace suitable for melting and cooling the at least one rod polysilicon section and at least one of chunk polysilicon, chip polysilicon or granular polysilicon in each mold by the directional solidification process.

16. The process of claim 15, and further comprising:
heating the plurality of molds until the at least one rod polysilicon section and the at least one of chunk polysilicon, chip polysilicon and granular polysilicon in each mold melt to a molten silicon mass, wherein the plurality of molds are each defined by a top and a bottom, and the furnace directs heat to the top and the bottom of each mold; and
cooling the plurality of molds thereby causing the molten silicon mass in each mold to crystallize and form a plurality of crystalline silicon ingots, wherein each crystalline silicon ingot is defined by a polycrystalline structure.

17. The process of claim 16, and further comprising slicing a plurality of crystalline silicon wafers from the plurality of crystalline silicon ingots.

18. The process of claim 17, and further comprising producing a plurality of photovoltaic cells from the plurality of crystalline silicon wafers.

19. As a new article of manufacture, a plurality of crystalline silicon ingots prepared in accordance with the process of claim 16.

20. A directional solidification process, comprising:
providing a mold suitable for melting and cooling polysilicon by a directional solidification process, wherein the mold is rectangular and includes a flat bottom;
loading a plurality of rod polysilicon sections into the mold in an offset-layered configuration or a crisscross-layered configuration;
loading at least one of chunk polysilicon, chip polysilicon or granular polysilicon into the mold;
heating the mold until the rod polysilicon sections and at least one of chunk polysilicon, chip polysilicon or granular polysilicon melt to form a molten silicon mass; and
cooling the the molten mass by the directional solidification process to cause the molten silicon mass to crystallize and form a polycrystalline silicon ingot within the mold.

21. The process of claim 20, and wherein a first one of the plurality of rod polysilicon sections is in contact with a second one of the plurality of rod polysilicon sections which is generally subjacent to the first one of the plurality of rod polysilicon sections.

22. The process of claim 20, and wherein the plurality of rod polysilicon sections are loaded in a longitudinally vertical orientation.

23. The process of claim 20, wherein the mold is defined by a length and a width, and the length and width of the mold are approximately equal.

24. The process of claim 20, wherein the mold is defined by a length and a width, and the length of the mold is within the range 58 cm to 70 cm and the width of the mold is within the range of 58 cm to 70 cm.

25. The process of claim 20, wherein the mold is defined by a height, and the height of the mold is within the range 38 cm to 43 cm.

26. The process of claim 20, wherein the rod polysilicon sections are each defined by a length, and the lengths of the rod polysilicon sections are within the range of 8 cm to 68 cm.

27. The process of claim 20, wherein the rod polysilicon sections are each defined by a diameter, and the diameters of the rod polysilicon sections are within the range of 80 mm to 140 mm.

28. The process of claim 20, wherein the rod polysilicon sections are each defined by a weight, and the weight of each rod polysilicon section is within the range of 4 kilograms to 15 kilograms.

29. The process of claim 20, wherein the rod polysilicon sections are initially prepared by a Siemens process.

30. The process of claim 20, wherein the chunk polysilicon is initially prepared by a Siemens process.

31. The process of claim 20, wherein the chip polysilicon is initially prepared by a Siemens process.

32. The process of claim 20, wherein the granular polysilicon is initially prepared by a fluidized-bed process.

33. The process of claim 20, and further comprising slicing a crystalline silicon wafer from the crystalline silicon ingot.

34. The process of claim 33, and further comprising producing a photovoltaic cell from the crystalline silicon wafer.

35. As a new article of manufacture, a crystalline silicon ingot prepared in accordance with the process of claim 20.

36. A directional solidification process, comprising:
providing a plurality of molds suitable for melting and cooling polysilicon by a directional solidification process, wherein each mold is rectangular and includes a flat bottom;
loading a plurality of rod polysilicon sections into each mold in an offset-layered configuration or a crisscross-layered configuration;
loading at least one of chunk polysilicon, chip polysilicon or granular polysilicon into each mold; and
placing the plurality of molds into a furnace suitable for melting and cooling the plurality of rod silicon sections and the at least one of chunk polysilicon, chip polysilicon or granular polysilicon by the directional solidification process.

37. The process of claim 36, and further comprising:
heating the plurality of molds until the plurality of rod polysilicon sections and the at least one of chunk polysilicon, chip polysilicon or granular polysilicon melt to a molten silicon masses; and
cooling the plurality of molds thereby causing the molten silicon masses to crystallize and form a plurality of crystalline silicon ingots, wherein the plurality of crystalline silicon ingots are defined by a polycrystalline structure.

38. The process of claim 37, and further comprising slicing a plurality of crystalline silicon wafers from the plurality of crystalline silicon ingots.

39. The process of claim 38, and further comprising producing a plurality of photovoltaic cells from the plurality of crystalline silicon wafers.

40. As a new article of manufacture, a plurality of crystalline silicon ingots prepared in accordance with the process of claim 37.

41. A directional solidification process, comprising:
providing a mold suitable for melting and cooling polysilicon by a directional solidification process, wherein the mold is rectangular and includes a flat bottom, the mold is defined by a length, a width and a height, the length of the mold is within the range 10 cm to 70 cm, the width of the mold is within the range 10 cm to 50 cm and the height of the mold is within the range 10 cm to 43 cm;
loading a plurality of rod polysilicon sections into the mold in an offset-layered configuration or a crisscross-layered configuration, wherein the plurality of rod polysilicon sections have been prepared by a Siemens process, the rod polysilicon sections are each defined by a length and a diameter, the diameter of the plurality of rod polysilicon sections is within the range of 80 mm to 140 mm and the length of the at least one of the rod polysilicon sections is within the range of 8 cm to 68 cm;
loading at least one of chunk polysilicon, chip polysilicon or granular polysilicon into the mold; and
placing the mold into a furnace suitable for melting and cooling the plurality of rod polysilicon sections and at least one of chunk polysilicon, chip polysilicon or granular polysilicon by a directional solidification process.

42. The process of claim 41, and further comprising:
heating the mold until the plurality of rod polysilicon sections and the at least one of chunk polysilicon, chip polysilicon or granular polysilicon melt to a molten silicon mass, wherein the mold is defined by a top and a bottom, and the furnace directs heat to the mold from the top and bottom; and cooling the mold thereby causing the molten silicon mass to crystallize to form a crystalline silicon ingot, wherein the crystalline silicon ingot is defined by a polycrystalline structure.

43. The process of claim 42, and further comprising slicing a crystalline silicon wafer from the crystalline silicon ingot.

44. The process of claim 43, and further comprising producing a photovoltaic cell from the crystalline silicon wafer.

45. As a new article of manufacture, a crystalline silicon ingot prepared in accordance with the process of claim 42.

46. A directional solidification process, comprising:

providing a plurality of molds suitable for melting and cooling polysilicon by a directional solidification process, wherein each mold is rectangular and includes a flat bottom, each mold is defined by a length, a width and a height, the length of each mold is within the range 10 cm to 70 cm, the width of each mold is within the range 10 cm to 50 cm and the height of each mold is within the range 10 cm to 43 cm;

loading a plurality of rod polysilicon sections into each mold in a offset-layered configuration or a crisscross-layered configuration, wherein the plurality of rod polysilicon sections have been prepared by a Siemens process, the rod polysilicon sections are each defined by a length and a diameter, the diameter of the plurality of rod polysilicon sections is within the range of 80 mm to 140 mm and the length of the plurality of rod polysilicon sections is within the range of 8 cm to 68 cm;

loading at least one of chunk polysilicon, chip polysilicon or granular polysilicon into each mold; and placing the plurality of molds into a furnace suitable for melting and cooling the plurality of rod polysilicon sections and the at least one chunk polysilicon, chip polysilicon or granular polysilicon by the directional solidification process.

47. The process of claim 46, and further comprising:

heating the plurality of molds until the plurality of rod polysilicon sections and the at least one of chunk polysilicon, chip polysilicon or granular polysilicon melt to a desired state of molten silicon masses, wherein the molds are each defined by a top and a bottom, and the furnace directs heat to each mold from the top and bottom; and cooling the plurality of molds thereby causing the molten silicon masses to crystallize to form a plurality of crystalline silicon ingots, wherein each crystalline silicon ingot is defined by a polycrystalline structure.

48. The process of claim 47, and further comprising slicing a plurality of crystalline silicon wafers from the plurality of crystalline silicon ingots.

49. The process of claim 48, and further comprising producing a plurality of photovoltaic cells from the plurality of crystalline silicon wafers.

50. As a new article of manufacture, a plurality of crystalline silicon ingots prepared in accordance with the process of claim 47.

* * * * *